US012656402B2

(12) United States Patent
Yen

(10) Patent No.: US 12,656,402 B2
(45) Date of Patent: Jun. 16, 2026

(54) ELECTRONIC DEVICE AND METHOD FOR CALIBRATING RSOC OF A BATTERY

(71) Applicant: Quanta Computer Inc., Taoyuan City (TW)

(72) Inventor: Wei-Ting Yen, Taoyuan City (TW)

(73) Assignee: QUANTA COMPUTER INC., Taoyuan City (TW)

( * ) Notice: Subject to any disclaimer, the term of this patent is extended or adjusted under 35 U.S.C. 154(b) by 881 days.

(21) Appl. No.: 18/056,760

(22) Filed: Nov. 18, 2022

(65) Prior Publication Data

US 2024/0077540 A1 Mar. 7, 2024

(30) Foreign Application Priority Data

Sep. 2, 2022 (TW) .................................. 111133298

(51) Int. Cl.
*G01R 31/374* (2019.01)
*G01R 31/387* (2019.01)
*G01R 31/396* (2019.01)

(52) U.S. Cl.
CPC ......... *G01R 31/374* (2019.01); *G01R 31/387* (2019.01); *G01R 31/396* (2019.01)

(58) Field of Classification Search
USPC ......................................................... 320/132
See application file for complete search history.

(56) References Cited

U.S. PATENT DOCUMENTS

| | | | |
|---|---|---|---|
| 5,751,134 A * | 5/1998 | Hoerner ................ | H02J 7/0048 |
| | | | 320/147 |
| 8,405,356 B2 | 3/2013 | Nakayama et al. | |
| 2011/0279094 A1 | 11/2011 | Nakatsuji et al. | |
| 2012/0105010 A1* | 5/2012 | Kinoshita ............. | H01M 10/63 |
| | | | 320/136 |

(Continued)

FOREIGN PATENT DOCUMENTS

| | | | |
|---|---|---|---|
| CN | 102472803 A | 5/2012 | |
| CN | 113311347 A | 8/2021 | |
| JP | 3807965 B2 * | 8/2006 | ........... G01R 31/392 |

(Continued)

OTHER PUBLICATIONS

Korean language office action dated Jan. 24, 2025, issued in application No. KR 10-2022-0180385.

(Continued)

*Primary Examiner* — Mohammed Alam
(74) *Attorney, Agent, or Firm* — McClure, Qualey & Rodack, LLP

(57) ABSTRACT

An electronic device includes a battery device, a capacity measuring unit, and a microprocessor. The battery device outputs its remaining capacity and fully charged capacity. The capacity measuring unit includes a sensing resistor, measures the battery current of the battery device using the sensing resistor, and integrates the battery current to obtain the actual capacity. The microprocessor stores the fully charged capacity. When the battery device is in a specific state, the microprocessor calculates the capacity difference (Continued)

<u>100</u> between the remaining capacity and the actual capacity. The microprocessor calibrates the fully charged capacity according to the ratio of the capacity difference to the remaining capacity.

7 Claims, 3 Drawing Sheets

(56)                    References Cited

U.S. PATENT DOCUMENTS

2013/0110428  A1      5/2013  Sun et al.
2019/0101595  A1*    4/2019  Kondo ................... H02J 7/005

FOREIGN PATENT DOCUMENTS

KR        20190075623  A       7/2019
KR        20210148803  A      12/2021
KR        20220007639  A       1/2022

OTHER PUBLICATIONS

Extended European Search Report dated Aug. 17, 2023, issued in application No. EP 22210501.7.
Chinese language office action dated Jun. 19, 2023, issued in application No. TW 111133298.

* cited by examiner

100

102 battery device

108

112

104 capacity measuring unit 120 sensing resistor

110

106 microprocessor

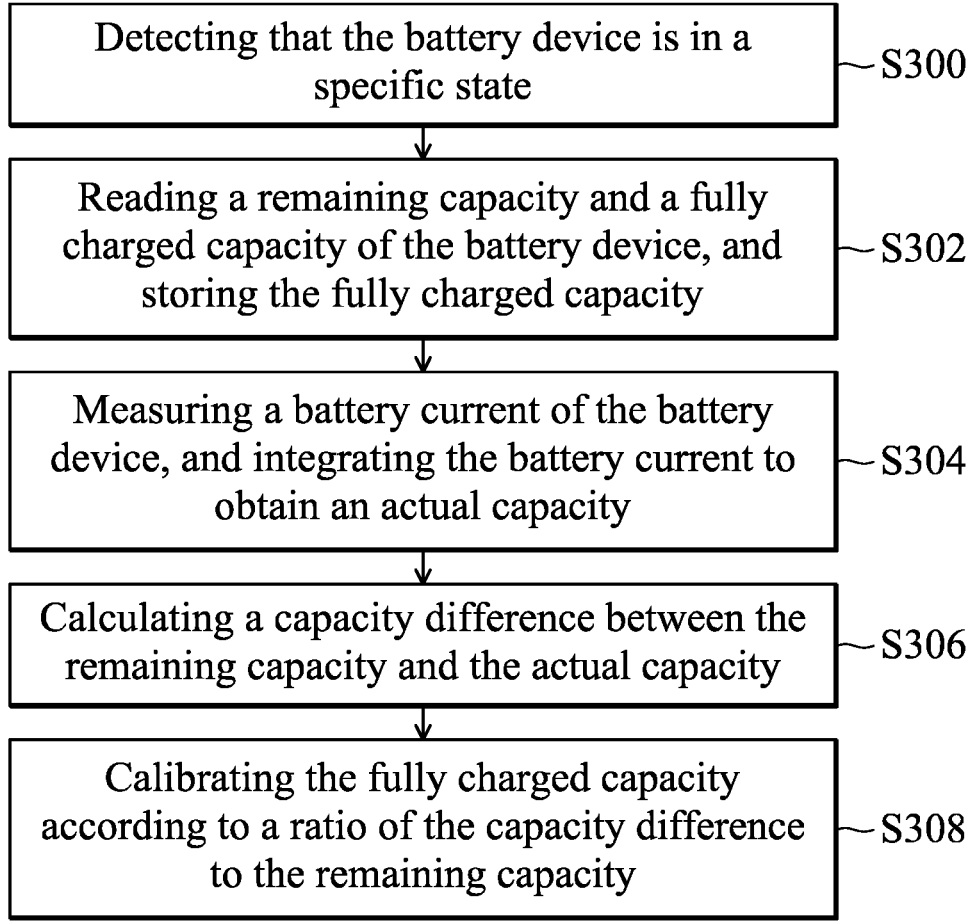

Detecting that the battery device is in a specific state —S300

Reading a remaining capacity and a fully charged capacity of the battery device, and storing the fully charged capacity —S302

Measuring a battery current of the battery device, and integrating the battery current to obtain an actual capacity —S304

Calculating a capacity difference between the remaining capacity and the actual capacity —S306

Calibrating the fully charged capacity according to a ratio of the capacity difference to the remaining capacity —S308

ELECTRONIC DEVICE AND METHOD FOR CALIBRATING RSOC OF A BATTERY

CROSS REFERENCE TO RELATED APPLICATIONS

This application claims the benefit of Taiwan Application No. 111133298, filed on Sep. 2, 2022, the entirety of which is incorporated by reference herein.

BACKGROUND OF THE INVENTION

Field of the Invention

The present invention relates to an electronic device, and, in particular, to an electronic device and a method for calibrating the relative state-of-charge (RSOC) of a battery.

Description of the Related Art

At present, in all electronic products equipped with rechargeable batteries, the basic method for calculating battery capacity is the integration of current, so all battery packs (including battery cells) have a gas-gauge to calculate their own capacity, and the gas-gauge will display of the existing battery capacity, and then transmit the battery capacity information to the system end for presentation through the communication interface. However, there is no other verification mechanism to confirm this estimate of battery capacity.

BRIEF SUMMARY OF THE INVENTION

An embodiment of the present invention provides an electronic device. The electronic device includes a battery device, a capacity measuring unit, and a microprocessor. The battery device outputs its remaining capacity and fully charged capacity. The capacity measuring unit includes a sensing resistor, measures the battery current of the battery device using the sensing resistor, and integrates the battery current to obtain the actual capacity. The microprocessor stores the fully charged capacity. When the battery device is in a specific state, the microprocessor calculates the capacity difference between the remaining capacity and the actual capacity. The microprocessor calibrates the fully charged capacity according to the ratio of the capacity difference to the remaining capacity.

According to the electronic device described above, the specific state includes the battery device being in a fully charged state, the battery device being in a fully discharged state, and the time in which the electronic device is in an off state being longer than a predetermined period.

According to the electronic device described above, the capacity measuring unit further includes an analog-to-digital converter. The analog-to-digital converter includes a first input end, a second input end, a first output end, and a second output end. The analog-to-digital converter detects the voltage across the sensing resistor through the first input end and the second input end, and outputs a voltage signal through the first output end or the second output end correspondingly according to the voltage.

According to the electronic device described above, the capacity measuring unit further includes a first NAND gate, a second NAND gate, and a clock device. The first NAND gate includes a first input end, a second input end, and an output end. The second NAND gate includes a first input end, a second input end, and an output end. The clock device

2 includes a first end and a second end. The clock device outputs a clock signal to the second input end of the first NAND gate through the first end, and outputs the clock signal to the first input end of the second NAND gate through the second end. The first NAND gate receives the voltage signal from the analog-to-digital converter through its own first input end. The second NAND gate receives the voltage signal from the analog-to-digital converter through its own second input end.

According to the electronic device described above, the battery device further outputs its relative state-of-charge (RSOC). The microprocessor further calculates the actual RSOC. The actual RSOC is equal to the quotient obtained by dividing the actual capacity by the fully charged capacity.

According to the electronic device described above, when the ratio of the capacity difference to the remaining capacity is higher than a predetermined value, the microprocessor calibrates the stored fully charged capacity of the battery device, so that the actual RSOC calculated by the microprocessor is equal to the RSOC of the battery device.

According to the electronic device described above, the predetermined value is 3%.

An embodiment of the present invention also provides a method for calibrating the relative state-of-charge (RSOC) of a battery. The method is suitable for an electronic device having a battery device, a capacity measuring unit, and a microprocessor. The method includes the stages detailed in the following paragraph. The specific state of the battery device is detected. The remaining capacity and the fully charged capacity of the battery device is read, and the fully charged capacity is stored. The battery current of the battery device is measured, and the battery current is integrated to obtain the actual capacity. The capacity difference between the remaining capacity and the actual capacity is calculated. The fully charged capacity is calibrated according to the ratio of the capacity difference to the remaining capacity.

According to the method described above, the method further includes the stages detailed in the following paragraph. The relative state-of-charge (RSOC) of the battery device is received. The actual RSOC is calculated. The actual RSOC is equal to the quotient obtained by dividing the actual capacity by the fully charged capacity. The stored fully charged capacity of the battery device is calibrated when the ratio of the capacity difference to the remaining capacity is higher than a predetermined value, so that the actual RSOC calculated by the microprocessor is equal to the RSOC of the battery device.

According to the method described above, the specific state includes the battery device being in a fully charged state, the battery device being in a fully discharged state, and the time in which the electronic device is in an off state being longer than a predetermined period.

BRIEF DESCRIPTION OF THE DRAWINGS

The present invention can be more fully understood by reading the subsequent detailed description with references made to the accompanying figures. It should be understood that the figures are not drawn to scale in accordance with standard practice in the industry. In fact, it is allowed to arbitrarily enlarge or reduce the size of components for clear illustration. This means that many special details, relationships and methods are disclosed to provide a complete understanding of the present invention.

FIG. 3 is a flow chart of a method for calibrating battery capacity in accordance with some embodiments of the present invention.

DETAILED DESCRIPTION OF THE INVENTION

Certain words are used to refer to specific elements in the specification and the claims. Those with ordinary knowledge in the technical field should understand that hardware manufacturers may use different terms to refer to the same component. The specification and the claims of the present invention do not use differences in names as a way to distinguish elements, but use differences in functions of elements as a criterion for distinguishing. The "comprise" and "include" mentioned in the entire specification and the claims are open-ended terms, so they should be interpreted as "including but not limited to". "Generally" means that within an acceptable error range, a person with ordinary knowledge in the technical field can solve the technical problem within a certain error range, and basically achieve the technical effect. In addition, the term "coupled" herein includes any direct and indirect electrical connection means. Therefore, if it is described in the text that a first device is coupled to a second device, it means that the first device can be directly electrically connected to the second device, or indirectly electrically connected to the second device through other devices or connecting means. The following descriptions are preferred ways to implement the present invention. The purpose is to illustrate the spirit of the present invention and not to limit the scope of protection of the present invention.

The following description is the best embodiment expected of the present invention. These descriptions are used to illustrate the general principles of the present invention and should not be used to limit the present invention. The protection scope of the present invention should be determined on the basis of referring to the scope of the claims of the present invention.

Figure 1:
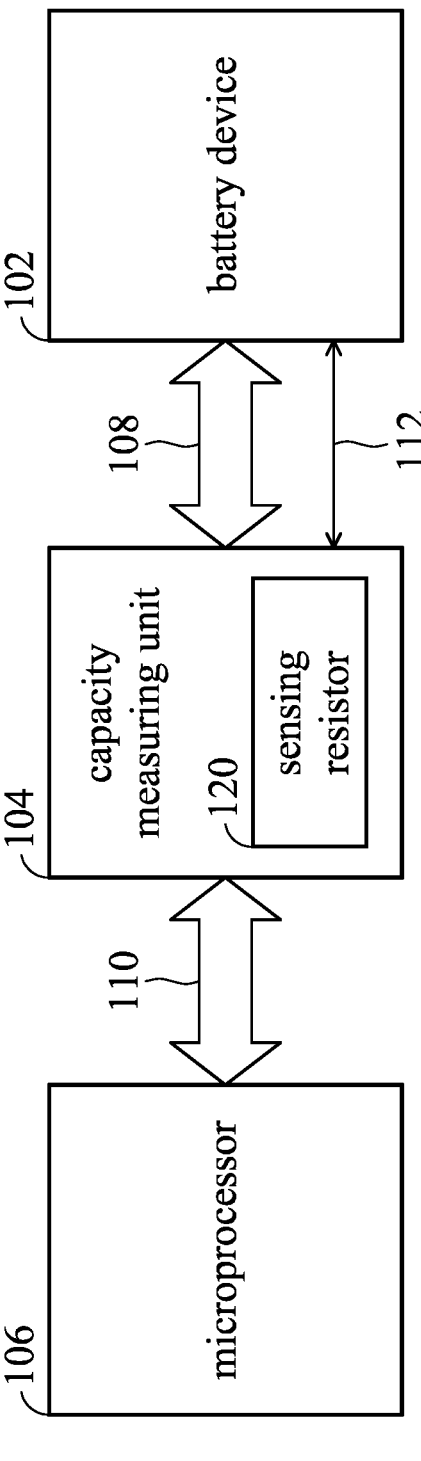
FIG. 1 is a schematic diagram of an electronic device 100 in accordance with some embodiments of the present invention.

FIG. 1 is a schematic diagram of an electronic device 100 in accordance with some embodiments of the present invention. As shown in FIG. 1, the electronic device includes a battery device 102, a capacity measuring unit 104, and a microprocessor 106. In some embodiments, the electronic device 100 can be any electronic device including a battery device inside, such as an electrical vehicle, a laptop, a tablet, a smart phone, but the present invention is not limited thereto. In some embodiments, the battery device 102 outputs the self-test battery voltage, the self-test battery current, the remaining capacity (RC), the fully charged capacity, and the relative state-of-charge (RSOC). In some embodiments, the battery device 102 includes a gas-gauge (not shown) to detect the self-test battery voltage, the self-test battery current, the remaining capacity, the fully charged capacity, and the relative state-of-charge of the battery device 102. In some embodiments, the gas-gauge of the battery device 102 obtains the RSOC by dividing the remaining capacity by the fully charged capacity.

In some embodiments, the battery device 102 sends the self-test battery voltage, the self-test battery current, the remaining capacity, the fully charged capacity, and the RSOC to the capacity measuring unit 104 though a communication interface 108. The battery device 102 further outputs the battery voltage and battery current to the capacity measuring unit 104 through a power line 112. In some embodiments, the capacity measuring unit 104 includes a sensing resistor 120. The capacity measuring unit 104 measures the battery current of the battery device 102 using the sensing resistor 104, and integrates the battery current to obtain the actual capacity. In some embodiments, the capacity measuring unit 104 includes a register (not shown) to store the intermediate value of the battery current integral, which is used to finally obtain the actual capacity. In some embodiments, the capacity measuring unit 104 sends the calculated actual capacity to microprocessor 106, and sends the remaining capacity, the fully charged capacity, and the RSOC from the battery device 102 to the microprocessor 106 through the communication interface 110 for subsequent processing.

After that, the microprocessor 106 receives and stores the fully charged capacity from the battery device 102. In some embodiments, the electronic device 100 includes a memory (not shown). The microprocessor 106 is electrically connected to the memory, and stores the fully charged capacity from the battery device 102 in the memory. When the battery device 102 is in a specific state, the microprocessor 106 calculates the capacity difference between the remaining capacity from the battery device 102 and the actual capacity from the capacity measuring unit 104, and calibrates the fully charged capacity according to the ratio of the capacity difference to the remaining capacity. In detail, the microprocessor 106 calculates the actual RSOC. The actual RSOC is equal to the quotient obtained by dividing the actual capacity from the capacity measuring unit 104 by the fully charged capacity from the battery device 102. When the ratio of the capacity difference to the remaining capacity from the battery device 102 is higher than a predetermined value, the microprocessor 106 calibrates (or adjusts) the stored fully charged capacity of the battery device 102, so that the actual RSOC calculated by the microprocessor 106 is equal to the RSOC of the battery device 102. In some embodiments, the predetermined value is 3%, but the present invention is not limited thereto.

For example, when the ratio of the capacity difference to the remaining capacity from the battery device 102 is higher than 3%, and the actual RSOC calculated by the microprocessor 106 is less than the RSOC from the battery device, the microprocessor 106 decreases the fully charged capacity stored in the memory, so that the actual RSOC becomes higher to be equal to the RSOC of the battery device 102. When the ratio of the capacity difference to the remaining capacity from the battery device 102 is lower than or equal to 3%, the microprocessor 106 does not update the fully charged capacity stored in the memory. In some embodiments, the specific state includes the following conditions. The battery device 102 is in a fully charged state, the battery device 102 is in a fully discharged state, and the time in which the electronic device 100 is in an off state is longer than a predetermined period. In some embodiments, the predetermined period is 10 minutes, but the present invention is not limited thereto.

Figure 2:
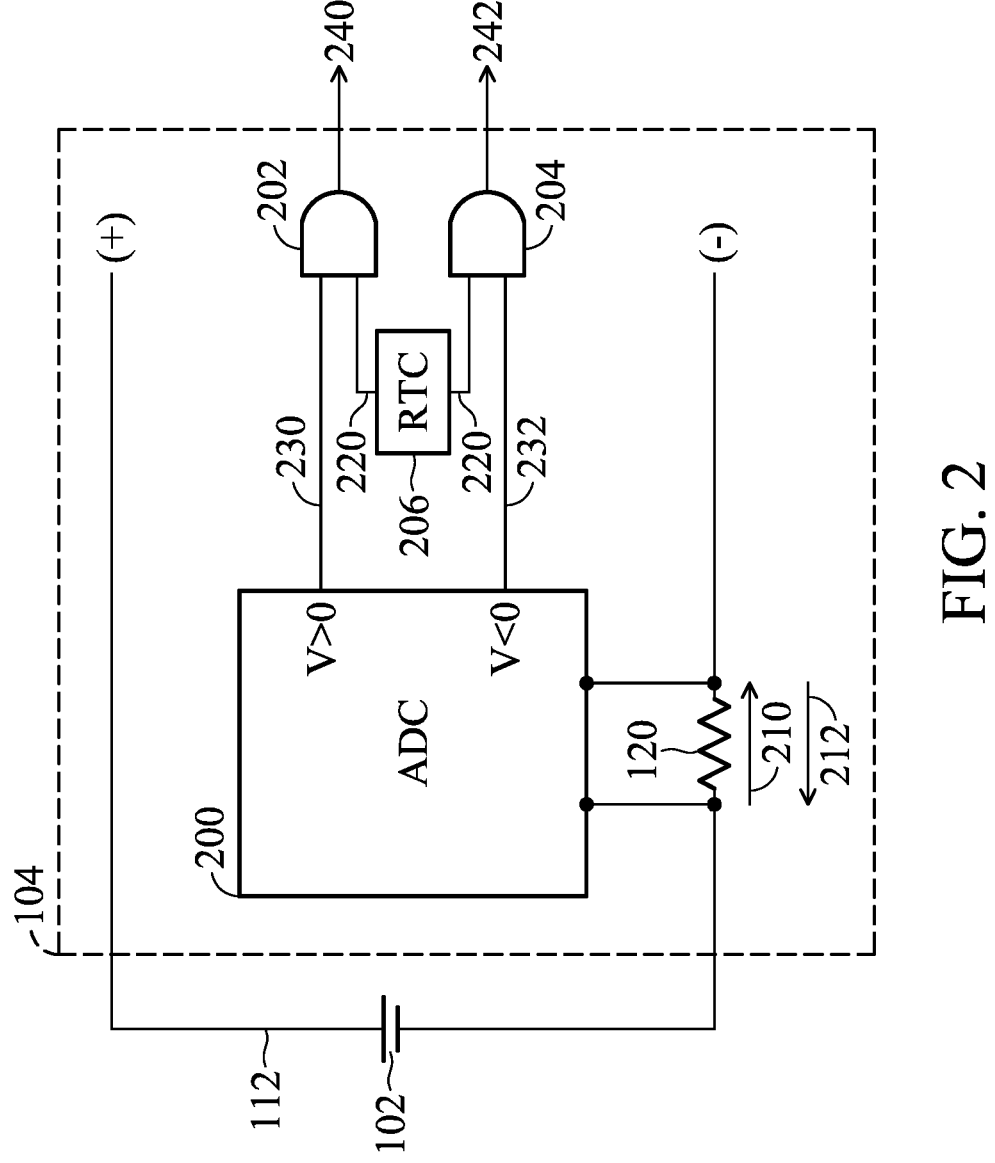
FIG. 2 is a detailed schematic diagram of a capacity measuring unit 104 of the electronic device 100 in FIG. 1 in accordance with some embodiments of the present invention.

FIG. 2 is a detailed schematic diagram of the capacity measuring unit 104 of the electronic device 100 in FIG. 1 in accordance with some embodiments of the present invention. As shown in FIG. 2, the capacity measuring unit 104 includes the sensing resistor 120, an analog-to-digital converter (ADC) 200, a NAND gate 202, a NAND gate 204, and a clock device (RTC) 206. In some embodiments, the ADC 200 includes a first input end, a second input end, a first output end (V>0), and a second output end (V<0). The ADC 200 detects a voltage (V) across the sensing resistor 120 through the first input end and the second input end, and outputs a voltage signal 230 through the first output end (V>0), or outputs a voltage signal 232 through the second output end (V<0) according to the voltage (V).

In some embodiments, when the battery device 102 is being charged, the current flows from the terminal (+) along the power line 112 to the positive electrode of the battery device 102, and then flows out from the negative electrode of the battery device 102, flowing through the sensing resistor 120 along direction 210 in the middle, and finally flowing to the terminal (−). In contrast, when the battery device 102 is discharging, the current flows from the positive electrode of the battery device 102 to the terminal (+) along the power line 112. After passing through the load, the current flows from the terminal (−) to the sensing resistor 120 along direction 212, finally flowing along the power line 112 to the negative electrode of the battery device 102. In other words, when the battery device 102 is being charged, resister 120 is the negative value. The ADC 200 outputs the voltage signal 232 having logic high level from its second output end (V<0) to the NAND gate 204. The NAND gate 204 simultaneously receives the clock signal 220 having logic high level from the clock device 206 and the voltage signal 232 having logic high level from the ADC 200. The NAND gate 204 performs AND operation on the clock signal 220 and the voltage signal 232, thereby outputting an operation result 242 having logic high level. In some embodiments, the operation result 242 at each time point is stored in a discharging resister (not shown), and can be accumulated in the discharging resister to achieve the technical effect of integrating the current. In some embodiments, the clock device 206 can be, for example, a real-time clock, but the present invention is not limited thereto.

Table 1 is a schematic table of the data of the calculation performed by the capacity measuring unit 104 and the microprocessor 106 when the battery device 102 is being charged.

TABLE 1

| Accumulative time (seconds) | Self-test battery voltage (V) | Self-test battery current (mA) | RSOC (%) | Remaining capacity (mAh) | Fully charged capacity (mAh) | Actual capacity (mAh) | Capacity difference (mAh) |
|---|---|---|---|---|---|---|---|
| 4725 | 8.675 | 1135 | 91 | 3356 | 3690 | 3325 | 31 |
| 4730 | 8.678 | 1129 | 91 | 3357 | 3690 | 3327 | 30 |
| 4735 | 8.679 | 1127 | 92 | 3359 | 3690 | 3328 | 31 |
| 4740 | 8.675 | 1121 | 92 | 3360 | 3690 | 3330 | 30 | the current measured by the sensing resistor 120 of the ADC 200 may be a positive value (for example, the voltage (V) across the sensing resistor 120 is the positive value). In contrast, when the battery device 102 is discharging, the current measured by the ADC 200 through the sensing resistor 120 may be a negative value (for example, the voltage (V) across the sensing resistor 120 is the negative value).

The NAND gate 202 includes a first input end, a second input end, and an output end. The NAND gate 204 includes a first input end, a second input end, and an output end. The clock device 206 includes a first end and a second end. In some embodiments, the clock device 206 outputs a clock signal 220 through its first end to the second input end of the NAND gate 202. The clock device 206 outputs the clock signal 220 through its second end to the first input end of the NAND gate 204. The NAND gate 202 receives the voltage signal 230 from the ADC 200 through its first input. The NAND gate 204 receives the voltage signal 232 from the ADC 200 through its second input. For example, when the battery device 102 is being charged, the ADC 200 detects that the voltage V across the sensing resistor 120 is the positive value. The ADC 200 outputs the voltage signal 230 having logic high level from its first output end (V>0) to the NAND gate 202. The NAND gate 202 simultaneously receives the clock signal 220 having logic high level from the clock device 206 and the voltage signal 230 having logic high level from the ADC 200. The NAND gate 202 performs AND operation on the clock signal 220 and the voltage signal 230, thereby outputting an operation result 240 having logic high level. In some embodiments, the operation result 240 at each time point is stored in a charging resister (not shown), and can be accumulated in the charging resister to achieve the technical effect of integrating the current.

Similarly, when the battery device 102 is discharging, the ADC 200 detects that the voltage V across the sensing In Table 1, the raw data of the accumulative time are from the clock device 206 of the capacity measuring unit 104 in FIG. 2. The raw data of the self-test battery voltage, the self-test battery current, the RSOC, the remaining capacity, and the fully charged capacity are all from the gas-gauge of the battery device 102. The raw data of the actual capacity is from the capacity measuring unit 104 in FIG. 2. The data listed in Table 1 is captured every 5 seconds, which is only an example and not a limitation of the present invention. Take the data when the accumulative time is 4730 seconds as an example, the microprocessor 106 receives the remaining capacity of 3357 mAh and the fully charged capacity of 3690 mAh from the battery device 102. The capacity measuring unit 104 measures the battery current (not shown in Table 1) using the sensing resistor 120, and integrates the battery current through the ADC 200, the NAND gate 202, the NAND gate 204 to obtain the actual capacity in Table 1 as 3327 mAh. In detail, the capacity measuring unit 104 of the present invention obtains the actual capacity in Table 1 through an equation 1 as follows.

$$\text{actual capacity} = (\text{battery current} * \text{time})/3600 + \text{last actual capacity} \qquad \text{equation 1}$$

In other words, in order to obtain the actual capacity when the accumulative time is 4730 seconds, the capacity measuring unit 104 multiplies the measured battery current by the interval time of 5 seconds to get a first intermediate result, and divides the first intermediate result by 3600 to get a second intermediate result to convert the unit from seconds to hours, and adds the actual capacity of 3325 mAh when the accumulative time is 4725 seconds to the second intermediate result, thereby finally obtaining the actual capacity of 3327 mAh when the accumulative time is 4730 seconds. After that, the microprocessor 106 subtracts the actual capacity of 3327 mAh from the remaining capacity of 3357 mAh to obtain the capacity difference of 30 mAh. Next, the microprocessor 106 calculates the ratio of the capacity difference to the remaining capacity. If the battery device 102 is in the specific state, and the ratio of the capacity difference to the remaining capacity is higher than a predetermined value (e.g., 3%), the microprocessor 106 updates the previously stored fully charged capacity (e.g., 3690 mAh) of the battery device, so that the actual RSOC (not listed in Table 1) calculated by the microprocessor 106 may be equal to the RSOC of the battery device 102 in Table 1. It can be seen in Table 1 that when the battery device 102 is being charged, the self-test battery current is the positive value.

Table 2 is a schematic table of the data of the calculation performed by the capacity measuring unit 104 and the microprocessor 106 when the battery device 102 is discharging.

TABLE 2

| Accumulative time (seconds) | Self-test battery voltage (V) | Self-test battery current (mA) | RSOC (%) | Remaining capacity (mAh) | Fully charged capacity (mAh) | Actual capacity (mAh) | Capacity difference (mAh) |
|---|---|---|---|---|---|---|---|
| 2085 | 8.190 | −701 | 90 | 3256 | 3657 | 3650 − 406 = 3244 | 12 |
| 2090 | 8.189 | −701 | 90 | 3255 | 3657 | 3650 − 407 = 3243 | 12 |
| 2095 | 8.189 | −701 | 89 | 3254 | 3657 | 3650 − 408 = 3242 | 12 |
| 2100 | 8.188 | −700 | 89 | 3253 | 3657 | 3650 − 409 = 3241 | 12 |

In Table 2, the raw data of the accumulative time are from the clock device 206 of the capacity measuring unit 104 in FIG. 2. Table 2 assumes that the initial actual capacity calculated by the capacity measuring unit 104 is 3650 mAh. The raw data of the self-test battery voltage, the self-test battery current, the RSOC, the remaining capacity, and the fully charged capacity are all from the gas-gauge of the battery device 102. The raw data of the actual capacity is from the capacity measuring unit 104 in FIG. 2. The data listed in Table 2 is captured every 5 seconds, which is only an example and not a limitation of the present invention. Take the data when the accumulative time is 2090 seconds as an example, the microprocessor 106 receives the remaining capacity of 3357 mAh and the fully charged capacity of 3657 mAh from the battery device 102. The capacity measuring unit 104 measures the battery current (not shown in Table 2) using the sensing resistor 120, integrates the battery current through the ADC 200, the NAND gate 202, the NAND gate 204, and subtracts the integration result from the initial actual capacity to obtain the actual capacity in Table 2 as 3243 mAh.

In order to obtain the actual capacity when the accumulative time is 2090 seconds, the capacity measuring unit 104 multiplies the measured battery current by the interval time of 5 seconds to get a first intermediate result, and divides the first intermediate result by 3600 to get a second intermediate result to convert the unit from seconds to hours, and adds the initial actual capacity of 3650 mAh to the second intermediate result, thereby finally obtaining the actual capacity of 3243 mAh when the accumulative time is 2090 seconds. After that, the microprocessor 106 subtracts the actual capacity of 3243 mAh from the remaining capacity of 3255 mAh to obtain the capacity difference of 12 mAh. Next, the microprocessor 106 calculates the ratio of the capacity difference to the remaining capacity. If the battery device 102 is in the specific state, and the ratio of the capacity difference to the remaining capacity is higher than a predetermined value (e.g., 3%), the microprocessor 106 updates the previously stored fully charged capacity (e.g., 3690 mAh) of the battery device, so that the actual RSOC (not listed in Table 2) calculated by the microprocessor 106 may be equal to the RSOC of the battery device 102 in Table 2. It can be seen in Table 2 that when the battery device 102 is discharging, the self-test battery current is the negative value.

FIG. 3 is a flow chart of a method for calibrating battery capacity in accordance with some embodiments of the present invention. As shown in FIG. 3, the method for calibrating battery capacity of the present invention includes detecting the specific state (S300) of the battery device. The method includes reading the remaining capacity and the fully charged capacity of the battery device. The method includes storing the fully charged capacity (S302). The method includes measuring the battery current of the battery device, and integrating the battery current to obtain the actual capacity (S304). The method includes calculating the capacity difference between the remaining capacity and the actual capacity (S306). The method includes calibrating the fully charged capacity according to the ratio of the capacity difference to the remaining capacity (S308). In some embodiments, the microprocessor 106 in FIG. 1 performs steps S300, S302, S306, and S308. The capacity measuring unit 104 in FIG. 1 performs step S304.

In some embodiments, the method for calibrating battery capacity of the present invention further includes receiving the relative state-of-charge (RSOC) of the battery device. The method further includes calculating the actual RSOC, wherein the actual RSOC is equal to the quotient obtained by dividing the actual capacity by the fully charged capacity. The method further includes calibrating the stored fully charged capacity of the battery device when the ratio of the capacity difference to the remaining capacity is higher than a predetermined value, so that the actual RSOC calculated by the microprocessor is equal to the RSOC of the battery device. In some embodiments, the predetermined value may be 3%, but the present invention is not limited thereto. In some embodiments, when the ratio of the capacity difference to the remaining capacity is less than or equal to the predetermined value, the method for calibrating battery capacity of the present invention does not update the stored fully charged capacity.

The electronic device 100 and the method for calibrating battery capacity of the present invention can solve the problem that the fully charged capacity (FCC) of the battery device 102 is affected by factors such as temperature, aging, and load. The gas-gauge of the battery device itself may calculate the fully charged capacity (FCC), and the system side (e.g., the microprocessor 106) may use the method for calibrating battery capacity of the present invention to compensate or reduce the tendency phenomenon of error. If the compensation exceeds +/−3%, it means that the battery device 102 may suffer from battery aging, large temperature changes, damages, broken parts, or current leakage. The microprocessor 106 can perform subsequent processing by receiving a notification signal related to the aforementioned problems.

In the several embodiments provided by the present invention, it should be understood that the disclosed system, device, and method can be implemented using other methods. The device embodiments described above are merely illustrative, for example, the division of units is only a logical function division, and there may be other divisions in actual implementation. For example, multiple units or elements can be combined or integrated into another system, or some features may be omitted or not implemented. In addition, the displayed or discussed mutual coupling or direct coupling or communicative connecting may be indirect coupling or communicatively connecting through some interfaces, device or units, and may be in electrical, mechanical, or other forms.

In addition, the functional units in the various embodiments of the present invention may be integrated into one processing unit, or each unit may exist alone physically, or two or more units may be integrated into one unit. The above-mentioned integrated unit can be realized either in the form of hardware or in the form of a software functional unit.

Although the present invention is disclosed above in the preferred embodiment, it is not intended to limit the scope of the present invention. Anyone with ordinary knowledge in the relevant technical field can make changes and modifications without departing from the spirit and scope of the present invention. Therefore, the protection scope of the present invention shall be determined by the scope of the claims.

What is claimed is:

1. An electronic device, comprising:
a battery device, comprising a gas-gauge, wherein the gas-gauge is configured to detect and output a remaining capacity and a fully charged capacity;
a capacity measuring unit, comprising a sensing resistor; wherein the capacity measuring unit is configured to measure a battery current of the battery device using the sensing resistor, and to integrate the battery current over time to obtain an actual capacity;
a microprocessor, configured to store the fully charged capacity, to calculate a capacity difference between the remaining capacity and the actual capacity when the battery device is in a specific state, and to calibrate the fully charged capacity according to a ratio of the capacity difference to the remaining capacity;
wherein the battery device further outputs a relative state-of-charge (RSOC); the microprocessor further calculates an actual RSOC; and the actual RSOC is equal to the quotient obtained by dividing the actual capacity by the fully charged capacity;
wherein when the ratio of the capacity difference to the remaining capacity is higher than a predetermined value, the microprocessor is configured to calibrate the stored fully charged capacity of the battery device, so that the actual RSOC calculated by the microprocessor is equal to the RSOC of the battery device.

2. The electronic device as claimed in claim 1, wherein the specific state comprises:
the battery device being in a fully charged state;
the battery device being in a fully discharged state; and
the time when the electronic device is in an off state being longer than a predetermined period.

3. The electronic device as claimed in claim 1, wherein the capacity measuring unit further comprises:
an analog-to-digital converter, comprising a first input end, a second input end, a first output end, and a second output end; wherein the analog-to-digital converter is configured to detect a voltage across the sensing resistor through the first input end and the second input end, and output a voltage signal through the first output end or the second output end according to the voltage.

4. The electronic device as claimed in claim 3, wherein the capacity measuring unit further comprises:
a first NAND gate, comprising a first input end, a second input end, and an output end;
a second NAND gate, comprising a first input end, a second input end, and an output end; and
a clock device, comprising a first end and a second end;
wherein the clock device is configured to output a clock signal to the second input end of the first NAND gate through the first end, and output the clock signal to the first input end of the second NAND gate through the second end;
wherein the first NAND gate is configured to receive the voltage signal from the analog-to-digital converter through the first input end, and the second NAND gate is configured to receive the voltage signal from the analog-to-digital converter through the second input end of itself.

5. The electronic device as claimed in claim 1, wherein the predetermined value is 3%.

6. A method for calibrating the relative state-of-charge (RSOC) of a battery, suitable for an electronic device having a battery device, a capacity measuring unit, and a microprocessor, comprising:
detecting that the battery device is in a specific state;
reading a remaining capacity and a fully charged capacity of the battery device, and storing the fully charged capacity, wherein the remaining capacity and the fully charged capacity is detected by a gas-gauge of the battery device;
measuring a battery current of the battery device by the capacity measuring unit, and integrating the battery current over time to obtain an actual capacity;
calculating a capacity difference between the remaining capacity and the actual capacity; and
calibrating the fully charged capacity according to the ratio of the capacity difference to the remaining capacity;
receiving the relative state-of-charge (RSOC) of the battery device;
calculating the actual RSOC; wherein the actual RSOC is equal to the quotient obtained by dividing the actual capacity by the fully charged capacity; and
calibrating the stored fully charged capacity of the battery device when the ratio of the capacity difference to the remaining capacity is higher than a predetermined value, so that the actual RSOC calculated by the microprocessor is equal to the RSOC of the battery device.

7. The method as claimed in claim 6, wherein the specific state comprises:
the battery device being in a fully charged state;

the battery device being in a fully discharged state; and the time in which the electronic device is in an off state being longer than a predetermined period.

\* \* \* \* \*